(12) United States Patent
Zawodny et al.

(10) Patent No.: US 10,496,286 B2
(45) Date of Patent: Dec. 3, 2019

(54) APPARATUSES AND METHODS FOR PARALLEL WRITING TO MULTIPLE MEMORY DEVICE STRUCTURES

(71) Applicant: Micron Technology, Inc., Boise, ID (US)

(72) Inventors: Jason T. Zawodny, Grand Rapids, MI (US); Glen E. Hush, Boise, ID (US); Troy A. Manning, Meridian, ID (US); Timothy P. Finkbeiner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 15/669,538

(22) Filed: Aug. 4, 2017

(65) Prior Publication Data

US 2017/0336989 A1  Nov. 23, 2017

Related U.S. Application Data

(63) Continuation of application No. PCT/US2016/015029, filed on Jan. 27, 2016.
(Continued)

(51) Int. Cl.
*G06F 3/06* (2006.01)
*G11C 7/10* (2006.01)
(Continued)

(52) U.S. Cl.
CPC .......... *G06F 3/0611* (2013.01); *G06F 3/0625* (2013.01); *G06F 3/0659* (2013.01);
(Continued)

(58) Field of Classification Search
CPC .... G06F 3/0611; G06F 3/0659; G06F 3/0683; G06F 12/02; G06F 12/06
(Continued)

(56) References Cited

U.S. PATENT DOCUMENTS 4,380,046 A   4/1983  Fung
4,435,792 A   3/1984  Bechtolsheim
(Continued)

FOREIGN PATENT DOCUMENTS

CN    102141905    8/2011
EP       0214718    3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
(Continued)

*Primary Examiner* — Than Nguyen
(74) *Attorney, Agent, or Firm* — Brooks, Cameron & Huebsch, PLLC

(57) ABSTRACT

The present disclosure includes apparatuses and methods for parallel writing to multiple memory device locations. An example apparatus comprises a memory device. The memory device includes an array of memory cells and sensing circuitry coupled to the array. The sensing circuitry includes a sense amplifier and a compute component configured to implement logical operations. A memory controller in the memory device is configured to receive a block of resolved instructions and/or constant data from the host. The memory controller is configured to write the resolved instructions and/or constant data in parallel to a plurality of locations the memory device.

21 Claims, 8 Drawing Sheets

Related U.S. Application Data

(60) Provisional application No. 62/112,868, filed on Feb. 6, 2015.

(51) Int. Cl.
| | | |
|---|---|---|
| *G11C 8/12* | (2006.01) | |
| *G11C 29/28* | (2006.01) | |
| *G06F 15/78* | (2006.01) | |
| *G11C 5/02* | (2006.01) | |
| *G11C 29/26* | (2006.01) | |

(52) U.S. Cl.
CPC ........ *G06F 3/0683* (2013.01); *G06F 15/7821* (2013.01); *G11C 7/10* (2013.01); *G11C 7/1006* (2013.01); *G11C 8/12* (2013.01); *G11C 29/28* (2013.01); *G11C 5/025* (2013.01); *G11C 2029/2602* (2013.01)

(58) Field of Classification Search
USPC ........................................................ 711/154
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,400,626 B1 | 6/2002 | Williams et al. | |
| 6,418,498 B1 | 7/2002 | Martwick | |
| 6,466,499 B1 | 10/2002 | Blodgett | |
| 6,510,098 B1 | 1/2003 | Taylor | |
| 6,535,963 B1 | 3/2003 | Rivers | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,778,435 B1 | 8/2004 | Han et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |

(56) References Cited

U.S. PATENT DOCUMENTS

| | | |
|---|---|---|
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0018846 A1 | 1/2003 | Fanning |
| 2003/0167426 A1 | 9/2003 | Slobodnik |
| 2003/0196030 A1* | 10/2003 | Elliott .............. G06F 9/30043 711/104 |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0026432 A1* | 2/2006 | Weirauch .............. G11B 20/10 713/178 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0303767 A1 | 12/2009 | Akerib et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |

(56) References Cited

FOREIGN PATENT DOCUMENTS

| WO | 2013081588 | 6/2013 |
|----|------------|--------|
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Kowarik et al., "Associative and Data Processing Mbit-DRAM", Proceedings of the 1990 International Conference on Computer Design: VLSI in Computer and Processors, Sep. 17-19, 1990, Cambridge, MA, pp. 421-424.

Extended European Search Report and Written Opinion for related EP Application No. 16746987.3, dated Jul. 5, 2018, 13 pages.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2016/015029, dated Jun. 29, 2016, 15 pages.

\* cited by examiner

| | 444 | 445 | 456 | 470 | 471 |
|---|---|---|---|---|---|
| | A | B | NOT OPEN | OPEN TRUE | OPEN INVERT |
| | 0 | 0 | 0 | 0 | 1 |
| | 0 | 1 | 0 | 1 | 0 |
| 475 → | | | ✕✕ | | |
| | 1 | 0 | 1 | 0 | 1 |
| | 1 | 1 | 1 | 1 | 0 |

4-1

4-2

| | | | | | | | | | | |
|---|---|---|---|---|---|---|---|---|---|---|
| | FF | 0 | 0 | 0 | 0 | 0 | 0 | 1 | 1 | 1 | ← 476 |
| | FT | 0 | 0 | 0 | 1 | 1 | 1 | 0 | 0 | 0 | ← 477 |
| | TF | 0 | 0 | 1 | 0 | 0 | 1 | 0 | 0 | 1 | ← 478 |
| | TT | 0 | 1 | 0 | 0 | 1 | 0 | 0 | 1 | 0 | ← 479 |
| | A | B | A | A*B | A*B̄ | A+B | B | AXB | A+B̄ | ĀXB̄ | B̄ | ← 447 |
| | 0 | 0 | 0 | 0 | 0 | 0 | 0 | 0 | 1 | 1 | 1 |
| | 0 | 1 | 0 | 0 | 0 | 1 | 1 | 1 | 0 | 0 | 0 |
| | 1 | 0 | 1 | 0 | 1 | 1 | 0 | 1 | 1 | 0 | 1 |
| | 1 | 1 | 1 | 1 | 0 | 1 | 1 | 0 | 1 | 1 | 0 |

480 brackets rows 476–479

*Fig. 4*

APPARATUSES AND METHODS FOR PARALLEL WRITING TO MULTIPLE MEMORY DEVICE STRUCTURES

PRIORITY INFORMATION

This application is a Continuation of International Application No. PCT/US2016/015029, filed Jan. 27, 2016, which claims the benefit to U.S. Provisional Application No. 62/112,868, filed Feb. 6, 2015, the entire contents of which are incorporated herein by reference in its entirety.

TECHNICAL FIELD

The present disclosure relates generally to semiconductor memory and methods, and more particularly, to apparatuses and methods for parallel writing to multiple memory device locations.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry may be external to the memory array, and data is accessed via a bus between the processing resources and the memory array to execute a set of instructions. Processing performance may be improved in a processor-in-memory device, in which a processing resource may be implemented internal and/or near to a memory (e.g., directly on a same chip as the memory array). A processing-in-memory device may save time by reducing and/or eliminating external communications and may also conserve power.

BRIEF DESCRIPTION OF THE DRAWINGS

FIG. 4 is a logic table illustrating selectable logic operation results implemented by a sensing circuitry shown in FIG. 3 in accordance with a number of embodiments of the present disclosure.

DETAILED DESCRIPTION

Figure 1A:
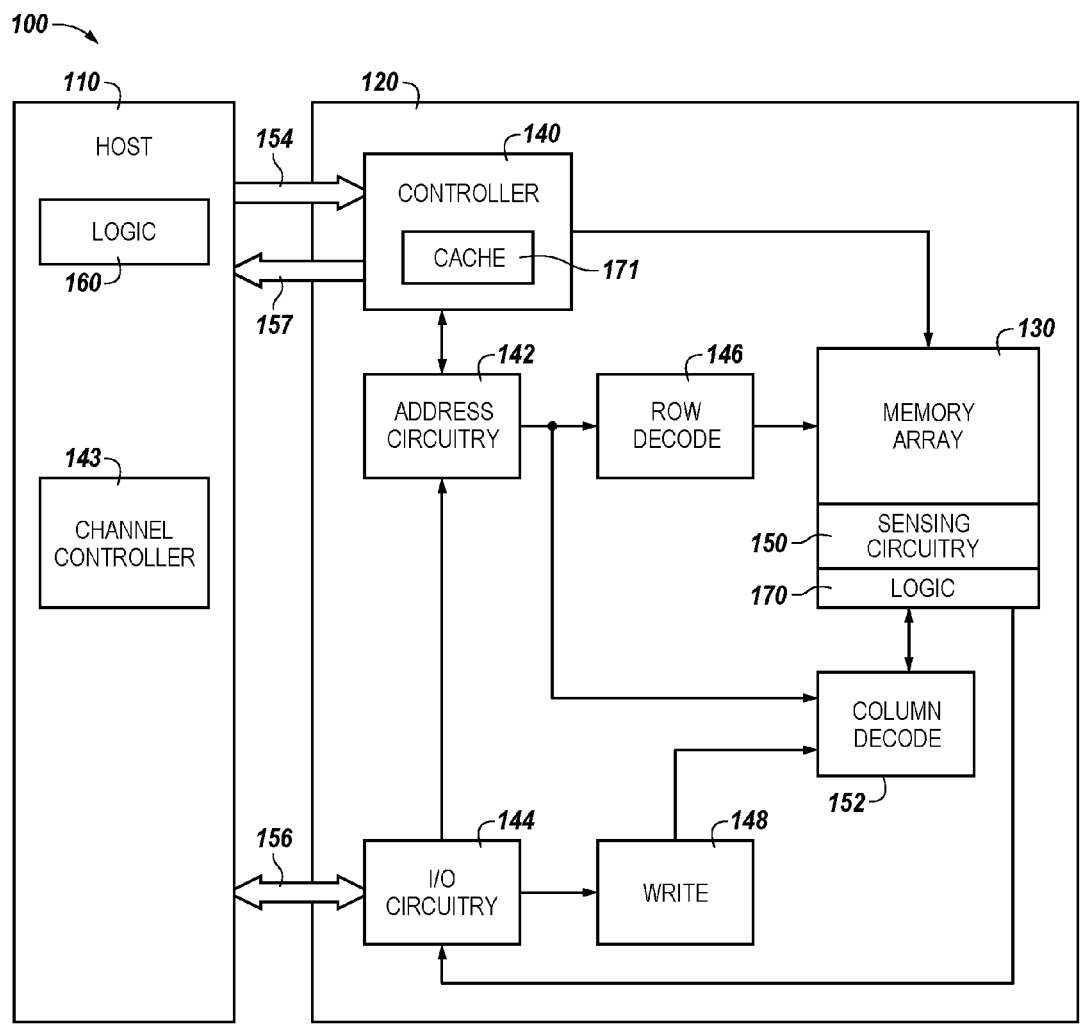
FIG. 1A is a block diagram of an apparatus in the form of a computing system including a memory device in accordance with a number of embodiments of the present disclosure.

The present disclosure includes apparatuses and methods for parallel writing to multiple memory device locations, e.g., to multiple processor-in-memory (PIM) arrays. In one embodiment, the apparatus comprises a memory device coupled to a host via a data bus and a control bus. The memory device includes an array of memory cells and sensing circuitry coupled to the array via a plurality of sense lines. The sensing circuitry includes a sense amplifier and a compute component configured to implement logical operations.

A memory controller is coupled to the array and sensing circuitry. The memory controller is configured to receive a block of resolved instructions from the host. The memory controller is configured to write the resolved instructions and/or "constant data", e.g., data that may be repeatedly used, to a plurality of locations in a bank and/or a plurality of banks on the memory device in parallel.

Typically, data will vary between different banks and subarrays within a processor-in-memory (PIM) device. However, the resolved, e.g., address translated, instructions to operate on that data may be identical among the different banks on the part. Additionally, constant data may be written into multiple banks, and into multiple subarrays to set up for PIM calculations, e.g., PIM commands.

Embodiments herein disclose a PIM capable device that can be associated with a selectable capability to write data to multiple banks in parallel, e.g., simultaneously, such as to avoid the need to perform multiple write sequences to achieve the same effect. For example, apparatus and methods described herein can facilitate writing data to a plurality of locations between multiple banks and subarrays on the same memory device simultaneously. Depending on the algorithms being executed on a PIM DRAM device disclosed techniques can save significant time in setting up the environment for executing blocks of PIM operations. This can then increase the effective data throughput to the memory device and increase the overall effective processing capability in a PIM system.

In at least one embodiment a bank arbiter to a memory device can be associated with a series of registers that are set to select the banks to be included in a "multicast" data write operation as well as the subarrays to be written to. A command protocol for the memory device can be augmented to indicate that writes (which in some embodiments can be masked writes) are being done in a multicast manner. The bank address bits and/or high-order row address bits, e.g., that are conventionally used to select a subarray or portion of a subarray in a PIM can be ignored.

The chip and bank level hardware can read the registers, e.g., previously set up to control multicast data write operations, and ensure that the data being written is distributed to the selected locations on the memory device. Writing of the data to all of the specified locations can happen in parallel, e.g., simultaneously, rather than in serial fashion. The banks and subarrays are selectable and can be configured before writing the common data.

Embodiments of the present disclosure provide an efficient method of providing a large number of instructions, with arguments, and/or constant data to the device and then route those instructions to an embedded processing engine, e.g., compute component, of the device with low latency, while preserving the protocol, logical, and electrical interfaces for the device. Hence, embodiments described herein may facilitate keeping the A/C bus at a standard width and data rate, reducing any amount of special design for the PIM and also making the PIM more compatible with existing memory interfaces in a variety of computing devices.

Additionally, the embodiments described herein may allow the host system to provide a large block of instructions and/or constant data to the PIM device at the beginning of an operation, significantly reducing, or completely eliminating, the interruptions in instruction execution to transfer more instructions to the PIM device and/or repetitive transfer of constant data. Previous compromises in the PIM device design and control flow for the embedded processing engine, e.g., compute component, included significant increases in the I/O used on the PIM device which would increase the fraction of non-productive space on the part, and increase the floor planning and noise containment complications, and increase the power dissipation on the part without adding additional computing performance. Also, other previous compromises included using relatively large, special purpose memory regions in the PIM device to store instructions while still not being large enough to hold large amounts of program instructions and/or constant data, thus increasing contention for the I/O resources on the overall chip and decreasing the effective speed of the computing engines.

As described in more detail below, the embodiments can allow a host system to allocate a number of locations, e.g., sub-arrays (or "subarrays") and/or portions of subarrays, in a plurality of banks to hold instructions and/or constant data. The host system can perform the address resolution on an entire block of program instructions, e.g., PIM command instructions, and/or data and write them into the allocated locations, e.g., subarrays/portions of subarrays, with a target bank. Writing these block instructions and/or data may utilize the normal write path to the memory device. As the reader will appreciate, while a DRAM style PIM device is discussed with examples herein, embodiments are not limited to a DRAM processor-in-memory (PIM) implementation.

In order to appreciate the improved program instruction techniques a discussion of an apparatus for implementing such techniques, e.g., a memory device having PIM capabilities, and associated host, follows. According to various embodiments, program instructions, e.g., PIM commands, involving a memory device having PIM capabilities can distribute implementation of the PIM commands and/or constant data over multiple sensing circuitries that can implement logical operations and can store the PIM commands and/or constant data within the memory array, e.g., without having to transfer such back and forth over an A/C and/or data bus between a host and the memory device. Thus, PIM commands and/or constant data for a memory device having PIM capabilities can be accessed and used in less time and using less power. For example, a time and power advantage can be realized by reducing the amount of data that is moved around a computing system to process the requested memory array operations (e.g., reads, writes, etc.).

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example.

A number of embodiments of the present disclosure include sensing circuitry and logic circuitry formed on pitch with an array of memory cells. The sensing circuitry and logic circuitry are capable of performing compute functions and storage, e.g., caching, local to the array of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system 100 including a memory device 120 in accordance with a number of embodiments of the present disclosure. As used herein, a memory device 120, memory controller 140, channel controller 143, bank arbiter 145, high speed interface (HSI) 141, memory array 130, sensing circuitry 150, and logic circuitry 170, as shown in FIGS. 1A-1E, might also be separately considered an "apparatus."

Figure 1B:
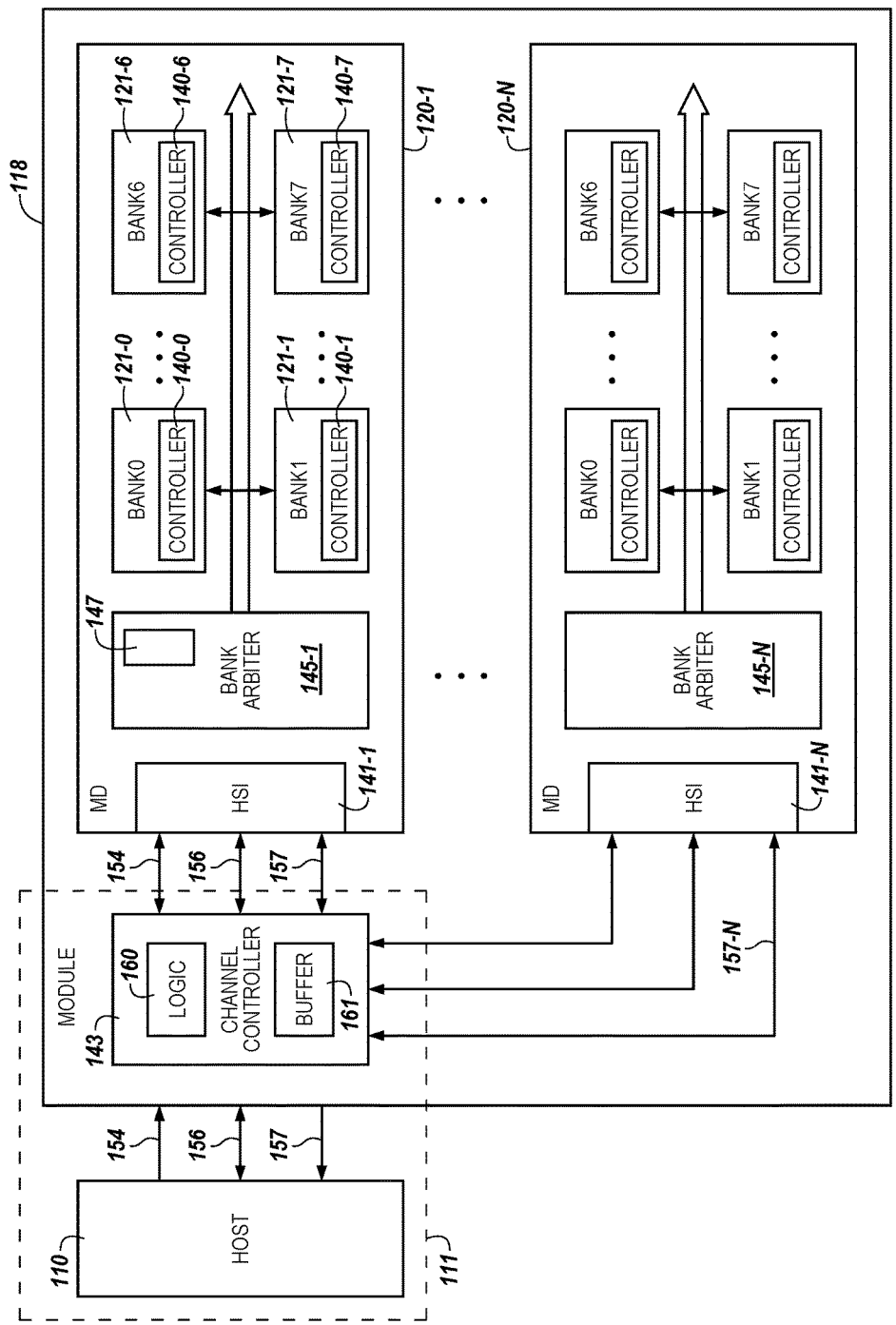
FIG. 1B is another block diagram of an apparatus in the form of a computing system including a memory device in accordance with a number of embodiments of the present disclosure.

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the memory controller 140 on the memory device 120 to a channel controller 143, through a high speed interface (HSI) 141 including an out-of-band bus 157 (shown in FIG. 1B), which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Memory controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110 and sequencing access to the array 130. The memory controller 140 can be a state machine, a sequencer, or some other type of controller. The controller 140 can control shifting data (e.g., right or left) in an array, e.g., memory array 130.

Examples of the sensing circuitry 150 are described further below, e.g., in FIGS. 2 and 3. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via an address and control (A/C) bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-bound (OOB) bus 157 associated with a high speed interface (HSI) 141, described more in connection with FIGS. 3-6, that is configured to report status, exception and other data information to the channel controller 143 to exchange with the host 110.

As shown in FIG. 1B, the channel controller 143 can receive the status and exception information from a high speed interface (HSI) (also referred to herein as a status channel interface) 141 associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a memory controller 140 and other components, including an array of memory cells 130 and sensing circuitry 150, additional logic circuitry 170, etc., as described in connection with FIG. 1A.

For example, each of the plurality of banks, e.g., Bank 0, . . . , Bank 7, in the plurality of memory devices 120-1, . . . 120-N can include address circuitry 142 to latch address signals provided over a data bus 156 (e.g., an I/O bus) through I/O circuitry 144. Status and/or exception information can be provided from the memory controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers 161 to store an program instructions and can include logic 160 to allocate a plurality of locations, e.g., subarrays, in the arrays of each respective bank to store bank commands, and arguments, (PIM commands) for the various banks associated with to operation of each of the plurality of memory devices 120-1, . . . , 120-N. The channel controller 143 can send commands, e.g., PIM commands, to the plurality of memory devices 120-1, . . . , 120-N to store those program instructions within a given bank of a memory device.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a memory controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. And, as above, the memory controller 140 can be a state machine, a sequencer, or some other type of controller. The controller 140 can control shifting data (e.g., right or left) in an array, e.g., memory array 130.

Figure 1C:
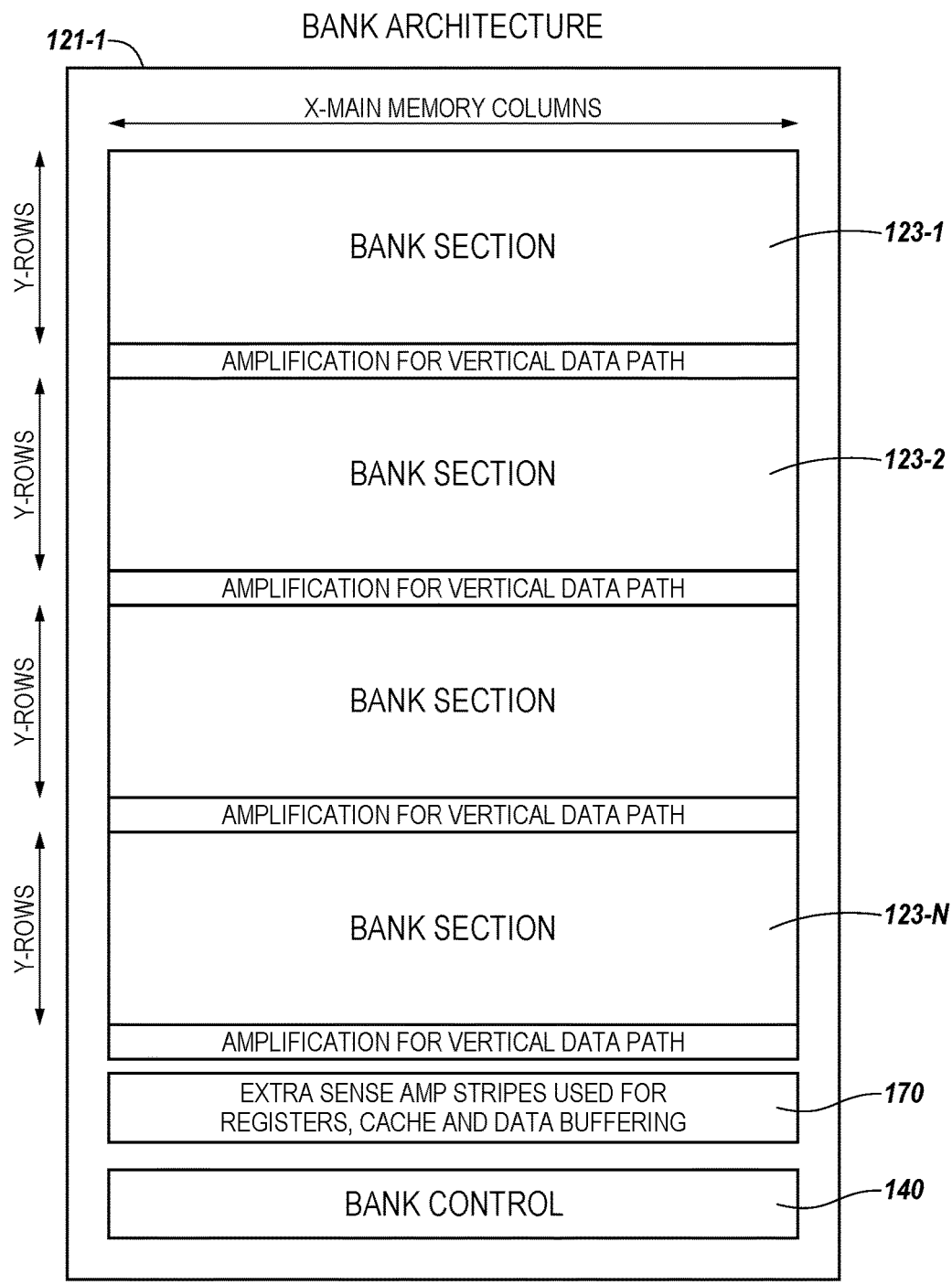
FIG. 1C is a block diagram of a bank to a memory device in accordance with a number of embodiments of the present disclosure.

FIG. 1C is a block diagram of a bank 121-1 to a memory device in accordance with a number of embodiments of the present disclosure. Bank 121-1 can represent an example bank to a memory device such as Bank 0, . . . , Bank 7 (121-0, . . . , 121-7) shown in FIG. 1B. As shown in FIG. 1C, a bank architecture can include a plurality of main memory columns (shown horizontally as X), e.g., 16,384 columns in an example DRAM bank. Additionally, the bank 121-1 may be divided up into sections, 123-1, 123-2, . . . , 123-N, separated by amplification regions for a data path. Each of the of the bank sections 123-1, . . . , 123-N can include a plurality of rows (shown vertically as Y), e.g., each section may include 16,384 rows in an example DRAM bank. Example embodiments are not limited to the example horizontal and/or vertical orientation of columns and rows described here or the example numbers thereof.

As shown in FIG. 1C, the bank architecture can include additional logic circuitry 170, including sense amplifiers, registers, cache and data buffering, that are coupled to the bank sections 123-1, . . . , 123-N. The additional logic circuitry 170 can represent another example of the cache 171 associated with the memory controller 140 in FIG. 1A or the additional logic array 170 associated with the sensing circuitry 150 and array 130 as shown in FIG. 1A. Further, as shown in FIG. 1C, the bank architecture can be associated with bank control, e.g., memory controller 140. The bank control shown in FIG. 1C can, in example, represent at least a portion of the functionality embodied by and contained in the memory controller 140 shown in FIGS. 1A and 1B.

Figure 1D:
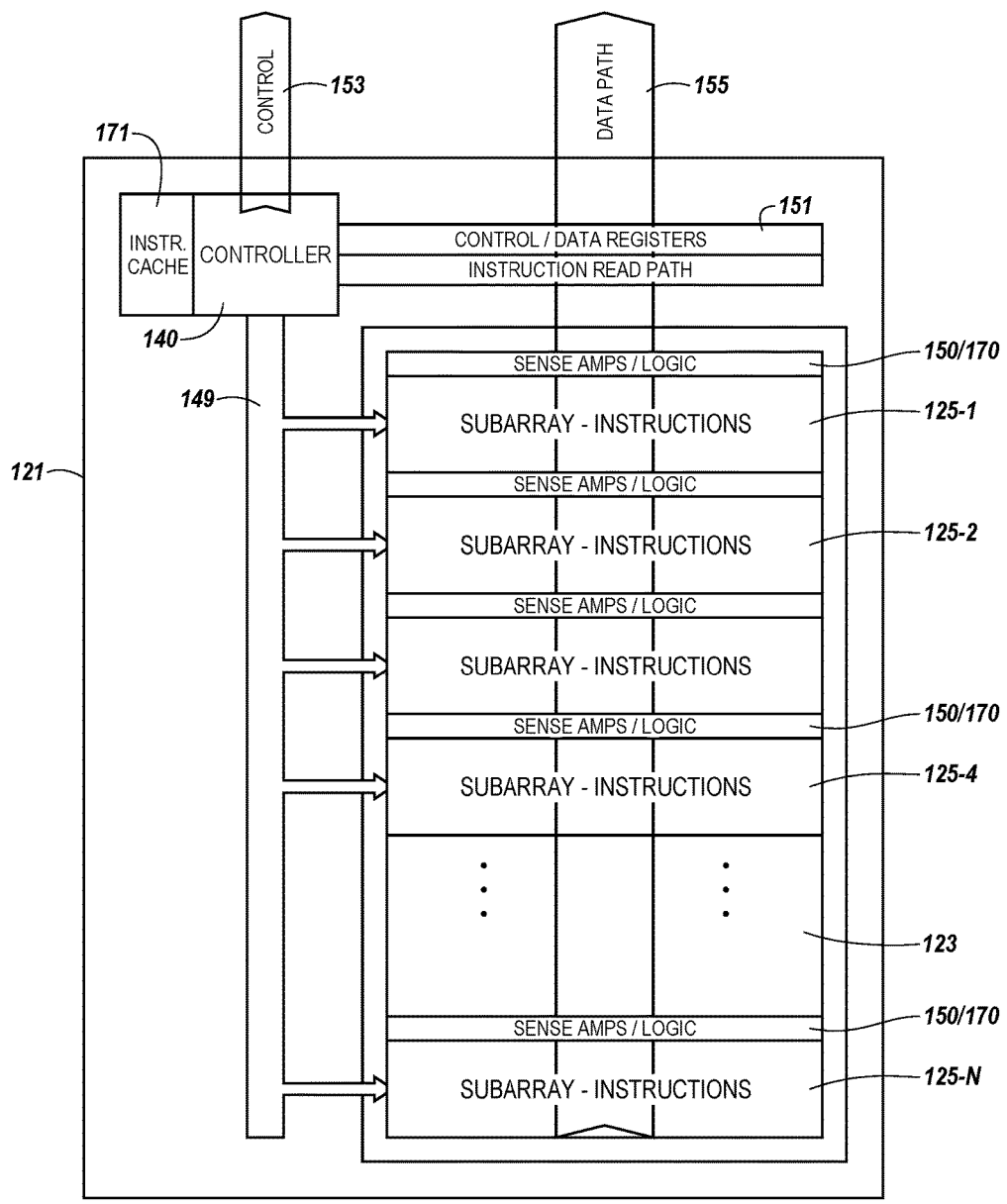
FIG. 1D is another block diagram of a bank to a memory device in accordance with a number of embodiments of the present disclosure.

FIG. 1D is another block diagram of a bank 121 to a memory device in accordance with a number of embodiments of the present disclosure. Bank 121 can represent an example bank to a memory device such as Bank 0, . . . , Bank 7 (121-0, . . . , 121-7) shown in FIG. 1B. As shown in FIG. 1D, a bank architecture can include an address/control (A/C) path, e.g., bus, 153 coupled to a memory controller, e.g., controller 140. Again, the controller 140 shown in FIG. 1D can, in example, represent at least a portion of the functionality embodied by and contained in the memory controller 140 shown in FIGS. 1A and 1B. Also, as shown in FIG. 1D, a bank architecture can include a data path, e.g., bus, 155, coupled to a plurality of control/data registers in an instruction and/or data, e.g., program instructions (PIM commands), read path and coupled to a plurality of bank sections, e.g., bank section 123, in a particular bank 121.

Figure 2:
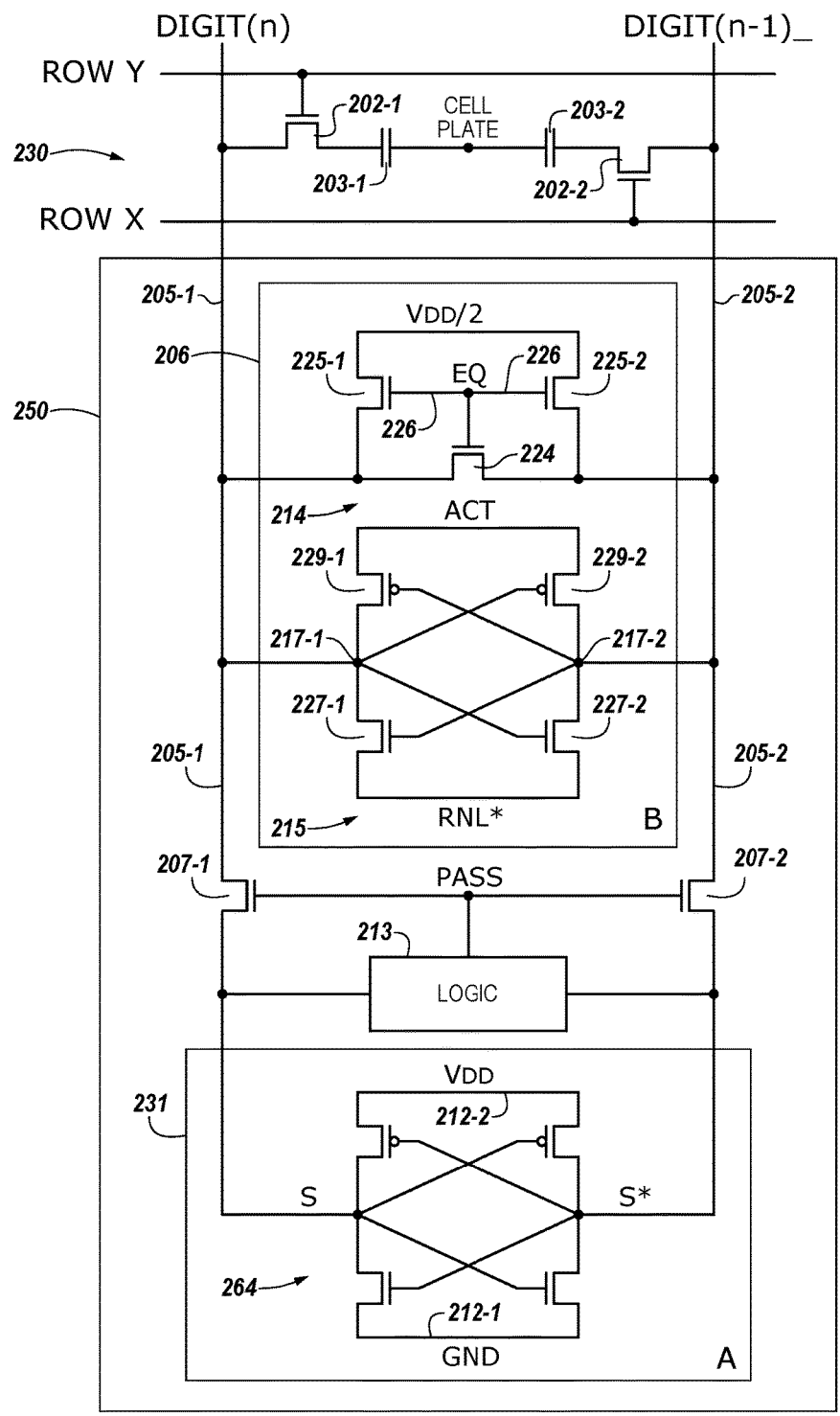
FIG. 2 is a schematic diagram illustrating sensing circuitry to a memory device in accordance with a number of embodiments of the present disclosure.
Figure 3:
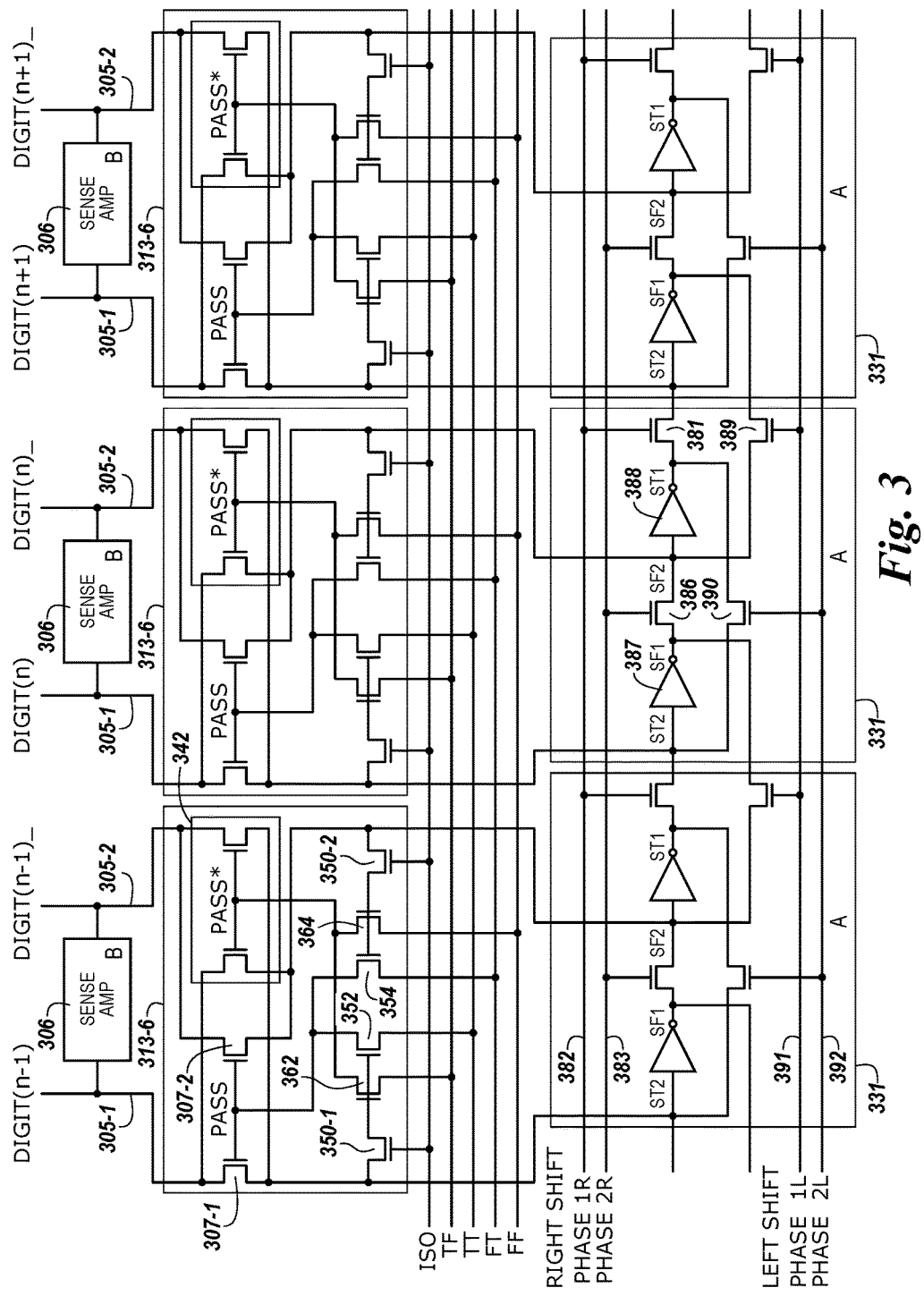
FIG. 3 is a schematic diagram illustrating sensing circuitry to a memory device in accordance with a number of embodiments of the present disclosure.

As shown in FIG. 1D, a bank section 123 can be further subdivided into a plurality of sub-arrays (or subarrays) 125-1, 125-2, . . . , 125-N again separated by of plurality of sensing circuitry and logic circuitry 150/170 as shown in FIG. 1A and described further in connection with FIGS. 2-4. In one example, a bank section 121 may be divided into sixteen (16) subarrays. However, embodiments are not limited to this example number.

FIG. 1D, illustrates an instruction cache 171 associated with the controller 140 and coupled to a write path 149 to each of the subarrays 125-1, . . . , 125-N in the bank section 123. In at least one embodiment, the plurality of subarrays 125-1, . . . , 125-N and/or portions of the plurality of subarrays may be referred to as a plurality of locations for storing program instructions, e.g., PIM commands, and/or constant data, e.g., data to set up PIM calculations, to a bank section 123 in a memory device.

According to embodiments of the present disclosure, the memory controller 140, e.g. controller 140 shown in FIG. 1D, is configured to receive a block of instructions and/or constant data from a host, e.g., host 110 in FIG. 1A. Alternatively, the block of instructions and/or constant data may be received to the memory controller 140 from a channel controller 143 either integrated with the host 110 or separate from the host, e.g., integrated in the form of a module 118 with a plurality of memory devices, 120-1, . . . , 120-N, as shown in FIG. 1B.

Receiving the block of instructions and/or constant data includes receiving a block of resolved instructions, e.g. PIM commands and/or data to set up PIM calculations, via a data bus 156 coupled to the host 110 and/or controller 143. According to embodiments, the memory controller 140 is configured to set a series of registers 147 in a bank arbiter 145 and/or in logic circuitry 170. The memory controller 140 and/or the bank arbiter 145 are configured to receive a multicast write command to the memory device 120. The memory controller 140 and/or the bank arbiter 145 is configured to read the set series of registers and to perform a multicast write operation to store resolved instructions and/or data in an array, e.g., array 130 shown in FIG. 1A and/or bank section 123 shown in FIG. 1D, of a bank, e.g., banks 121-0, . . . , 121-7, shown in FIGS. 1B, 1C and 1D. The memory controller 140 can include logic in the form of hardware circuitry and/or application specific integrated circuitry (ASIC). The memory controller 140 can thus control multicast data write operations. The memory controller 140 is further configured to route the resolved instructions and/or constant data to the sensing circuitry, including a compute component, such as sensing circuitry shown as 150 in FIG. 1A and compute components 231 and 331 in FIGS. 2 and 3, to perform logical functions and/or operations, e.g., program instruction execution (PIM command execution), as described herein.

According to embodiments, the instructions are resolved, e.g. written by a programmer and/or provided to the host 110 and/or controller 143, and are received from a channel controller to a bank arbiter 145 in each of a plurality of memory devices 120-1, . . . , 120-N, as shown in FIG. 1B. In at least one embodiment the memory controller 140 is configured to receive an augmented dynamic random access memory (DRAM) command protocol to indicate when writes are to be performed in a multicast manner. As shown in FIG. 1D, in at least one embodiment the memory controller 140 is configured to use DRAM protocol and DRAM logical and electrical interfaces to receive the resolved instructions and/or constant data from the host 110 and/or channel controller 143 and to route the resolved instructions and/or constant data to a compute component of sensing circuitry 150, 250 and/or 350. As shown next in the example of FIG. 1E, in at least one embodiment the memory controller 140 is configured to perform a multicast data write operation to resolved locations in a plurality of subarrays and/or portions of a plurality of subarrays in a plurality of banks using the DRAM write path.

Figure 1E:
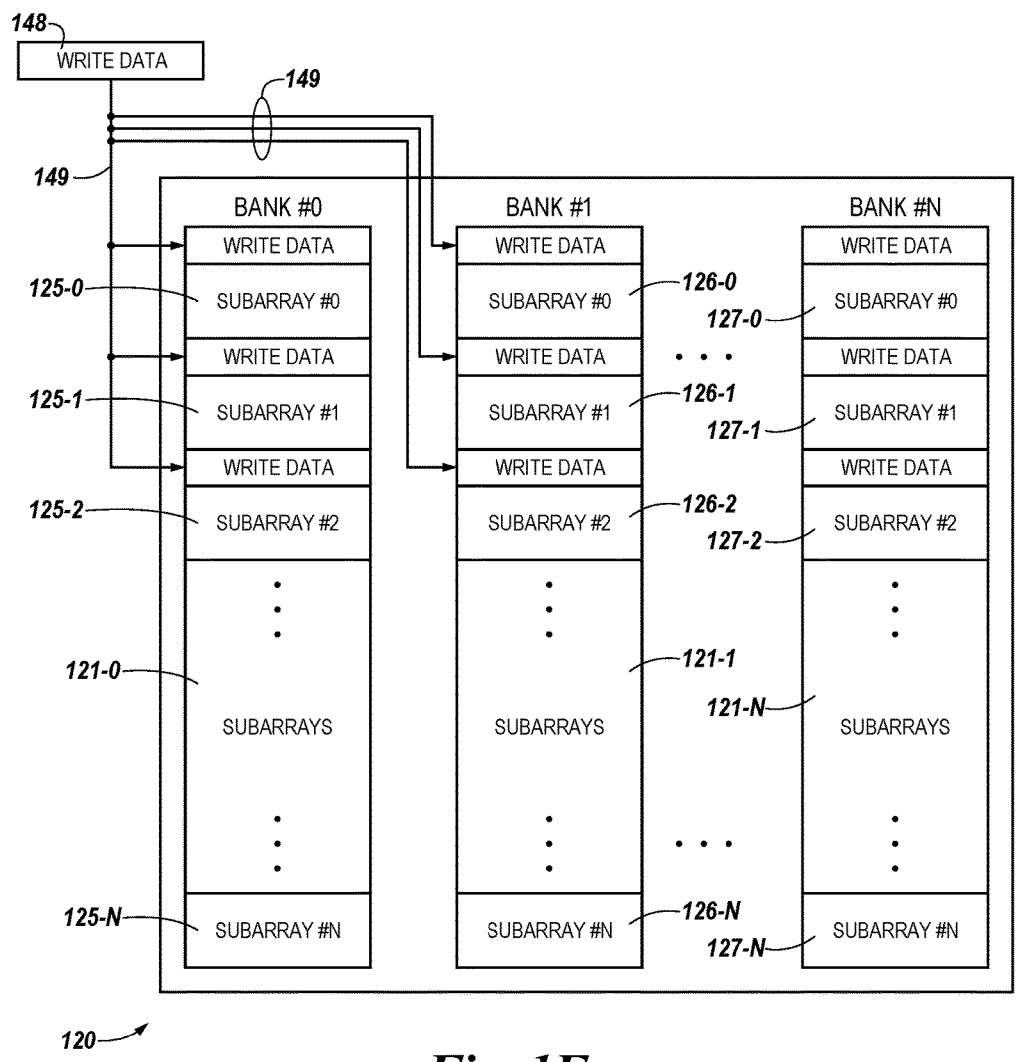
FIG. 1E is a block diagram of a plurality of banks to a memory device in accordance with a number of embodiments of the present disclosure.

FIG. 1E is a block diagram of a plurality of banks to a memory device in accordance with a number of embodiments of the present disclosure. In the example of FIG. 1E a plurality of banks 121-0, . . . , 121-N (Bank 0, Bank 1, . . . , Bank N) are shown coupled to a memory device 120. Each respective bank 121-0, . . . , 121-N can include a plurality of subarrays, e.g., 125-0, . . . , 125-N and/or portions of subarrays for Bank 0, 126-0, . . . , 126-N for Bank 1, and 127-0, . . . , 127-N for Bank N.

In the example of FIG. 1E, the memory device 120 can receive a multicast write command to a bank arbiter 145. The bank arbiter can read the series of registers 147 set to resolved locations and send the resolved instructions and/or constant date to the plurality of banks 121-0, . . . , 121-N to perform the multicast data write operation in parallel to the plurality of locations for the plurality of banks 121-0, . . . , 121-N and for the plurality of subarrays, e.g., 125-0, . . . , 125-N for Bank 0, 126-0, . . . , 126-N for Bank 1, and 127-0, . . . , 127-N for Bank N, in each bank using a write controller/driver 148 and the DRAM write path 149. In the example of FIG. 1E, a common set of resolved instructions (data), e.g., PIM commands and/or constant data to set up PIM calculations, is written into three (3) subarrays in each of the first two banks of the memory device 120, e.g., subarrays 125-0, 125-1, and 125-2 of Bank 121-0 and subarrays 126-0, 126-1, and 126-2 of Bank 121-1.

Embodiments, however, are not limited to the example of FIG. 1E. In alternative embodiments, the channel controller 143 is configured to send the multicast command to select ones of the plurality of memory devices 120-1, . . . , 120-N. And, the relevant bank arbiters, 145-1, . . . , 145-N are configured to send the resolved instructions and/or constant data to select ones of the plurality of banks, 121-0, . . . , 121-7, etc. In at least one embodiment, the subarrays and/or portions of subarrays are different among the select ones of the plurality of banks.

Hence, resolved instructions can be received to a plurality of banks via a bank arbiter 145 in each memory device 120 in a plurality of memory devices 120-1, . . . , 120-N from a channel controller 143. The resolved instructions can be resolved by the channel controller 143. As described above, a series of registers 147, set to select particular banks 121-0, . . . , 121-N, may be provided to the bank arbiter 145. However, in various embodiments, a series of registers may additionally be provided to the each of the plurality of banks 121-0, . . . , 121-N in association with the memory controller 140 and/or logic circuitry 170. For example, a series of registers in a given bank 121 can be set to mask address bits for a plurality of locations in the plurality of banks 121-0, . . . , 121-N in each memory device 120. Further, a series of registers can be set in the memory controller 140 of each of the plurality of banks 121-0, . . . , 121-N to mask address bits for a plurality of locations of a plurality of subarrays, e.g., 125-0, 125-1, 125-2, or portion of subarrays in each bank, e.g., 121-0. A multicast write command can be received to the bank arbiter in the plurality of memory devices from a channel controller 143. The series of registers set in the bank arbiter, logic circuitry, and/or set in the memory controllers of the plurality of banks, can be read. A multicast data write operation can be performed under the control of the memory controller 140, to write in parallel to the resolved locations for the plurality of banks and for the plurality of subarrays or portions of subarrays in each bank using the DRAM write path. And, the resolved locations for the plurality of subarrays can be different between the resolved locations of the plurality of banks.

In some embodiments, as seen in FIG. 1B, the array of memory cells (130 in FIG. 1A) includes a plurality of banks of memory cells 120-1, . . . , 120-N and the memory device 120 includes a bank arbiter 145 coupled to each of the plurality of banks 120-1, . . . , 120-N. In such embodiments, each bank arbiter is configured to receive a block of instructions including a plurality of program instructions (e.g., PIM commands) and/or constant data relevant to a particular bank from the bank arbiter 145. The bank arbiter can receive a multicast write command and read the series of registers 147 associated with in the bank arbiter 145 and send the resolved instruction and/or constant date to the plurality of locations in the plurality of banks 121-0, . . . , 121-N. The memory controller 140 can then store resolved instructions in the received block of instructions and/or the received constant data to a plurality of locations for the particular bank as allocated by the host 110 and/or channel controller 143. The host 110 and/or channel controller 143 can be configured to resolve the instructions, e.g., address translate the plurality of locations, for the bank arbiter 145 to assign to banks of the memory device 120. In at least one embodiment, as shown in FIG. 1D, the plurality of locations includes a number of subarrays 125-1, . . . , 125-N in the DRAM banks 121-1, . . . , 121-7 and/or portions of subarrays.

In some additional examples of parallel writing to multiple memory device structures, each memory controller 140 can be configured to receive program instructions, e.g., PIM commands, and/or constant data, e.g., data to set up PIM calculations, from the host 110 and/or channel controller 143, e.g., on A/C bus 154. Each memory controller 140 can be configured to use the techniques described above, to write the PIM commands and/or constant data in parallel to multiple PIM devices. In the manner, a memory controller can be configured to receive a command to start execution of a instruction block received to a given bank, 121-1, . . . , 121-7. The memory controller 140 may be configured to then retrieve instructions and/or constant data, e.g., on read data path 155 with control and data registers 151, from the plurality of locations for the particular bank and execute using the compute component of the sensing circuitry 150. The memory controller 140 may cache retrieved instructions and/or constant data local to the particular bank, e.g. in instruction cache 171 and/or logic circuitry 170, to handle branches, loops, logical and data operations contained within the instruction's block execution. So configured, the memory controller 140 can re-cache retrieved instructions and/or constant data as needed. Thus, the size of a dedicated instruction memory (cache) on a PIM device may not have to be increased for a PIM system.

Further, according to embodiments, the memory controller 140 is configured such that a bank 121 can receive a subsequent instruction block of program instructions and/or constant data relevant to the particular bank and store instructions in the received instruction block and/or received constant data to a plurality of locations for the particular bank while, e.g., in parallel, the memory controller 140 is executing a previously received instruction block or using previous constant data. Hence, the embodiments described herein avoid needing to wait for future, or a next set of instructions, e.g., PIM commands, to be received from a host 110 and/or channel controller 143. Instead, the apparatus and methods devices described herein can facilitate a backing store in the PIM device for program instructions and can facilitate pre-writing a subsequent instruction block and/or constant data into allocated locations, while executing a previously received instruction block, in order to facilitate the start of future calculations in the PIM system, e.g., PIM DRAM. These and other advantages to the embodiments disclosed herein will be apparent to a read of ordinary skill in the art.

As the reader will appreciate, and as described in more detail in the examples of FIGS. 2-4, the memory controller 140 is configure to control the execution of resolved instructions, e.g., PIM commands, and/or access to constant data, e.g., data to set up PIM calculations, by controlling the sensing circuitry 150, including compute components 251 and/or 351, to implement logical functions such as AND, OR, NOT, NAND, NOR, and XOR logical functions. Additionally the memory controller 140 is configured to control the sensing circuitry 150 to perform non-Boolean logic operations, including copy, compare and erase operations, as part of executing program instructions, e.g., PIM commands.

FIG. 2 is a schematic diagram illustrating sensing circuitry 250 in accordance with a number of embodiments of the present disclosure. The sensing circuitry 250 can correspond to sensing circuitry 150 shown in FIGS. 1A and 1B. The sense amplifier 206 of sensing circuitry 250 can correspond to sense amplifiers 206 shown in FIG. 2, and the compute component 231 of sensing circuitry 250 can correspond to sensing circuitry, including compute component, 150 shown in FIG. 1A, for example.

A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1), DIGIT(n)/DIGIT(n), DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 413.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (DJ having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry, including compute component, 150 shown in FIG. 1A, for example. The logical operation selection logic 313 shown in FIG. 3 can correspond to logical operation selection logic 413 shown in FIG. 4, for example.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

According to the embodiment illustrated in FIG. 3, the compute components 331 can comprise respective stages (e.g., shift cells) of a loadable shift register configured to shift data values left and right. For example, as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 305-1 and 305-2 when the isolation transistors are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. For example, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 313-7 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal PassF can be activated (e.g., high) to OPEN the swap transistors 342 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values (e.g., inverse operands and/or inverse result), among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry 850 are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device, wherein the memory device comprises:
an array of memory cells;
sensing circuitry coupled to the array via a plurality of sense lines, the sensing circuitry including sense amplifiers and a compute component configured to implement logical operations;
a memory controller coupled to the array and sensing circuitry, the memory controller configured to:
use a DRAM protocol and DRAM logical and electrical interfaces to receive the resolved instructions and/or constant data from a host; and
write the resolved instructions to a plurality of locations in the array in parallel; and
a bank arbiter, wherein the bank arbiter is configured to:
address translate a received multicast command; and
send the resolved instructions and/or constant data to a bank associated with the memory controller in order to write to a plurality of locations in the bank in parallel.

2. The apparatus of claim 1, where the memory controller is configured to:
receive resolved constant data; and
write the resolved constant data to a plurality of locations in the array in parallel.

3. The apparatus of claim 1, wherein the bank arbiter is configured to address translate the multicast command using a series of registers associated with the bank arbiter.

4. The apparatus of claim 1, wherein the bank arbiter is configured to receive the multicast command via a channel controller coupled to the host.

5. The apparatus of claim 1, wherein the apparatus comprises a bank arbiter coupled to a plurality of banks in the memory device, and wherein the bank arbiter is configured to:
receive a multicast command via an augmented dynamic random access memory (DRAM) command protocol; and
wherein the augmented DRAM command protocol is received using a DRAM control bus coupled the memory device.

6. The apparatus of claim 5, wherein the augmented DRAM command protocol indicates to the bank arbiter that writes are to be performed in a multicast manner.

7. The apparatus of claim 1, wherein the apparatus comprises a bank arbiter coupled to a plurality of banks in the memory device and the bank arbiter comprises logic to set bank address bits and row address bits in a series of registers for a plurality of locations in the plurality of banks.

8. The apparatus of claim 7, wherein the bank arbiter is configured to:
receive a multicast write command via a DRAM control bus coupled to the memory device;
read the series of registers; and
send the resolved instructions and/or constant data to a relevant memory controller to write in parallel to the plurality of locations.

9. The apparatus of claim 1, wherein the resolved instructions include processor-in-memory (PIM) commands.

10. An apparatus, comprising:
a memory device, wherein the memory device comprises a plurality of banks coupled to a bank arbiter, the bank arbiter configured to:
receive a multicast command;
read registers associated with the multicast command; and
send resolved instructions and/or constant data to the selected banks of the plurality of banks, wherein each bank comprises:
an array of memory cells;
sensing circuitry coupled to the array via a plurality of sense lines, the sensing circuitry including sense amplifiers and a compute component configured to implement logical operations; and
a memory controller coupled to the array and the sensing circuitry, wherein the memory controller is configured to:
receive resolved instructions and/or constant data sent to the bank; and write the resolved instructions and/or constant data to the bank.

11. The apparatus of claim 10, wherein the memory controller is configured to write the resolved instructions and/or constant data to a plurality of subarrays in the selected banks of the respective plurality of banks.

12. The apparatus of claim 11, wherein the plurality of subarrays are different among select ones of the plurality of banks.

13. The apparatus of claim 10, wherein the apparatus comprises a plurality of memory devices coupled to the host via a channel controller, wherein the apparatus is configured to:
receive the multicast command to relevant bank arbiters, among the plurality of memory devices, from the channel controller;
receive the multicast command to relevant memory controllers, among the selected banks of the plurality of banks of the respective memory device.

14. An apparatus, comprising:
a channel controller coupled to a plurality of memory devices, the channel controller configured to send a multicast command to the plurality of memory devices; and
a bank arbiter for each memory device coupled to the channel controller, each bank arbiter coupled to a plurality of banks in the respective memory device, each bank arbiter configured to:
receive the multicast command from the channel controller;
read registers associated with the bank arbiter responsive to the received multicast command; and
send resolved instructions and/or constant data to a selected bank of the plurality of banks based on the read registers; and
wherein each bank comprises:
an array of memory cells;
sensing circuitry coupled to the array via a plurality of sense lines, the sensing circuitry including sense amplifiers and a compute component configured to implement logical operations; and
a memory controller coupled to the array and the sensing circuitry, wherein the memory controller is configured to perform a data write operation to the selected bank of the plurality of banks.

15. The apparatus of claim 14, wherein the resolved instructions and/or constant data are address translated by the channel controller.

16. The apparatus of claim 14, wherein the memory controller is configured to control the sensing circuitry to:
implement logical functions including AND, OR, NOT, XOR, NAND, and NOR logical functions; and
perform non-Boolean logic operations including copy, compare and erase.

17. The apparatus of claim 14, wherein:
the array of memory cells are dynamic random access memory (DRAM) cells and the data write operation to the selected bank is to a plurality of subarrays in the selected bank;
the memory controller is configured to use a DRAM protocol and DRAM logical and electrical interfaces for non-multicast write operations; and
the channel controller is configured to send an augmented DRAM command to the bank arbiter in the respective memory device to indicate when a multicast write operation is to be performed.

18. A method for operating a memory device to parallel write to a plurality of locations, comprising:
receiving resolved instruction and/or constant data to the memory device, wherein the memory device comprises:
an array of memory cells;
sensing circuitry coupled to the array, the sensing circuitry including a sense amplifier and a compute component configured to implement logical operations; and
a memory controller coupled to the array and the sensing circuitry; and
receiving a multicast write command at the memory controller;
writing the resolved instructions and/or constant data to a plurality of memory devices; and
wherein writing the resolved instructions and/or constant data comprises writing resolved instructions and/or constant data associated with processing in memory (PIM) commands to the plurality of memory devices
reading a series of registers set on the memory controller to send the resolved instructions and/or constant data to a plurality of subarrays in a bank associated with the memory controller; and
performing a multicast write operation to send the resolved instructions and/or constant data to the plurality of locations in the memory device.

19. The method of claim 18, wherein receiving the multicast write command comprises receiving an augmented dynamic random access memory (DRAM) write command at the memory controller from a channel controller.

20. An apparatus, comprising:
a memory device, wherein the memory device comprises:
an array of memory cells;
sensing circuitry coupled to the array via a plurality of sense lines, the sensing circuitry including sense amplifiers and a compute component configured to implement logical operations; and
a memory controller coupled to the array and sensing circuitry, the memory controller configured to:
receive a block of resolved instructions; and
write the resolved instructions to a plurality of locations in the array in parallel; and
a bank arbiter coupled to a plurality of banks in the memory device, and wherein the bank arbiter is configured to:
receive a multicast command via an augmented dynamic random access memory (DRAM) command protocol; and
wherein the augmented DRAM command protocol is received using a DRAM control bus coupled the memory device.

21. An apparatus, comprising:
a memory device, wherein the memory device comprises:
an array of memory cells;
sensing circuitry coupled to the array via a plurality of sense lines, the sensing circuitry including sense amplifiers and a compute component configured to implement logical operations; and
a memory controller coupled to the array and sensing circuitry, the memory controller configured to:
receive a block of resolved instructions; and
write the resolved instructions to a plurality of locations in the array in parallel; and
a bank arbiter coupled to a plurality of banks in the memory device and the bank arbiter comprises logic to set bank address bits and row address bits in a series of registers for a plurality of locations in the plurality of banks.

\* \* \* \* \*